United States Patent [19]
Nogami

[11] Patent Number: 6,010,960
[45] Date of Patent: Jan. 4, 2000

[54] METHOD AND SYSTEM FOR PROVIDING AN INTERCONNECT HAVING REDUCED FAILURE RATES DUE TO VOIDS

[75] Inventor: Takeshi Nogami, Sunnyvale, Calif.

[73] Assignee: Advanced Micro Devices, Inc., Sunnyvale, Calif.

[21] Appl. No.: 08/959,591

[22] Filed: Oct. 29, 1997

[51] Int. Cl.[7] .......................... H01L 21/28; H01L 21/283; H01L 21/44; H01L 21/441
[52] U.S. Cl. .......................... 438/653; 438/687; 257/751; 257/752; 257/762
[58] Field of Search .................................... 438/687, 643, 438/642, 661, 710, 627, 692, 625, 652, 653, 656; 420/479; 357/71; 257/762; 427/535, 526

[56] References Cited

U.S. PATENT DOCUMENTS

| | | | |
|---|---|---|---|
| 4,525,434 | 6/1985 | Morikawa et al. | 428/674 |
| 4,632,806 | 12/1986 | Morikawa et al. | 420/479 |
| 4,976,839 | 12/1990 | Inoue | 204/192 |
| 4,985,750 | 1/1991 | Hoshino | 357/71 |
| 5,266,526 | 11/1993 | Aoyama et al. | 437/195 |
| 5,470,789 | 11/1995 | Misawa | 437/190 |
| 5,572,072 | 11/1996 | Lee | 257/751 |
| 5,654,232 | 8/1997 | Gardner | 438/661 |

*Primary Examiner*—Olik Chaudhuri
*Assistant Examiner*—Bernard E. Souw
*Attorney, Agent, or Firm*—Sawyer & Associates

[57] ABSTRACT

A system and method for providing an interconnect on a substrate is disclosed. The method and system include providing a first layer, a first barrier layer, and a second layer. The first layer is subject to electromigration and has a thickness. The thickness of the first layer is smaller than what is required to support formation of a void. The first barrier layer is resistant to electromigration. The first barrier layer is disposed between the first layer and the second layer. In a second aspect, the method and system include providing a first layer and a first barrier layer. The first layer is subject to electromigration and has a thickness. The thickness of the first layer is smaller than what is required to support formation of a void. The first barrier layer is resistant to electromigration.

19 Claims, 5 Drawing Sheets

METHOD AND SYSTEM FOR PROVIDING AN INTERCONNECT HAVING REDUCED FAILURE RATES DUE TO VOIDS

FIELD OF THE INVENTION

The present invention relates to a method and system for providing copper or aluminum interconnects and more particularly to a method and system for providing copper interconnects having reduced failure due to voids.

BACKGROUND OF THE INVENTION

Typically, a damascene process is used to form interconnects for semiconductor processing. First, a trench is formed in a substrate. A barrier metal is deposited to prevent the metal which will form the interconnect from diffusing through the substrate. Typically, copper or aluminum is then deposited until the copper fills the trench, forming an interconnect.

As the copper fills the trench, there is a finite probability of the copper pinching off, leaving a void within the copper interconnect. Because copper is subject to electromigration, any void can work as a nucleus for growing larger voids within the interconnect. A void can, therefore, grow to fill a portion of the copper interconnect. When this occurs, the copper interconnect fails.

Accordingly, what is needed is a system and method for reducing the impact of voids and electromigration in such interconnects. The present invention addresses such a need.

SUMMARY OF THE INVENTION

The present invention provides a method and system for providing an interconnect on a substrate. The method and system comprise providing a first layer, a first barrier layer, and a second layer. The first layer is subject to electromigration and has a thickness. The thickness of the first layer is smaller than what is required to support formation of a void. The first barrier layer is resistant to electromigration. The first barrier layer is disposed between the first layer and the second layer. In a second aspect, the method and system include providing a first layer and a first barrier layer. The first layer is subject to electromigration and has a thickness. The thickness of the first layer is smaller than what is required to support formation of a void. The first barrier layer is resistant to electromigration.

According to the system and method disclosed herein, the present invention provides an interconnect having reduced failure due to voids, thereby increasing overall system performance.

DETAILED DESCRIPTION OF THE INVENTION

The present invention relates to an improvement in formation of copper interconnects. The following description is presented to enable one of ordinary skill in the art to make and use the invention and is provided in the context of a patent application and its requirements. Various modification to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1A:
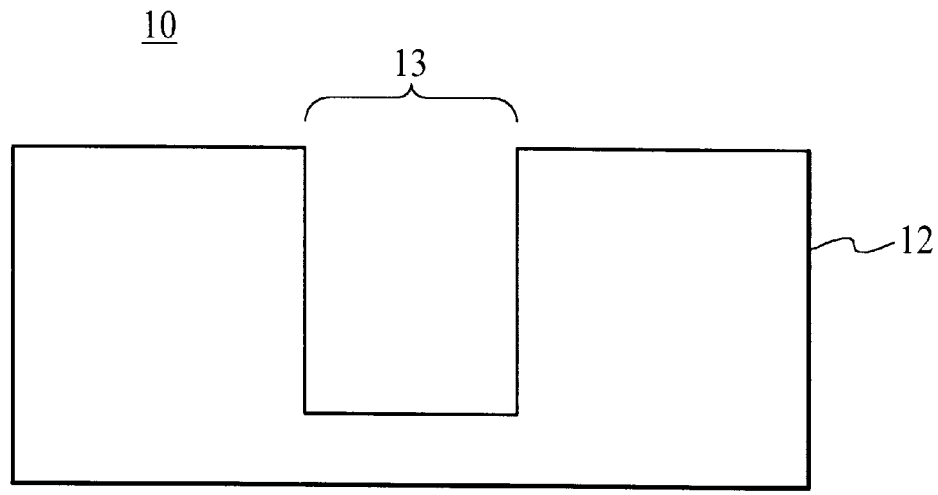
FIGS. 1A–1D are block diagrams depicting the cross-section of a copper interconnect during formation of the copper interconnect using a conventional process.
Figure 1B:
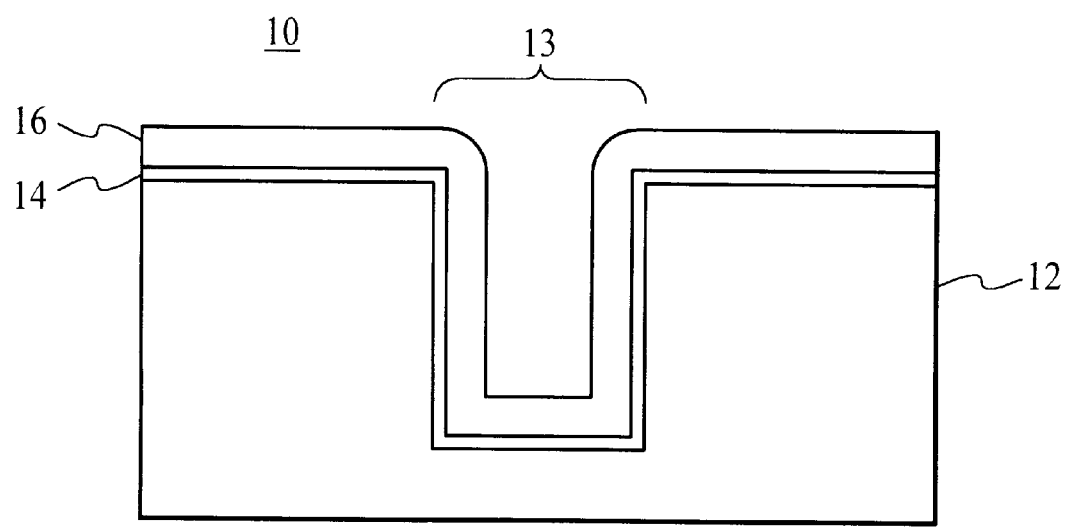
Figure 1C:
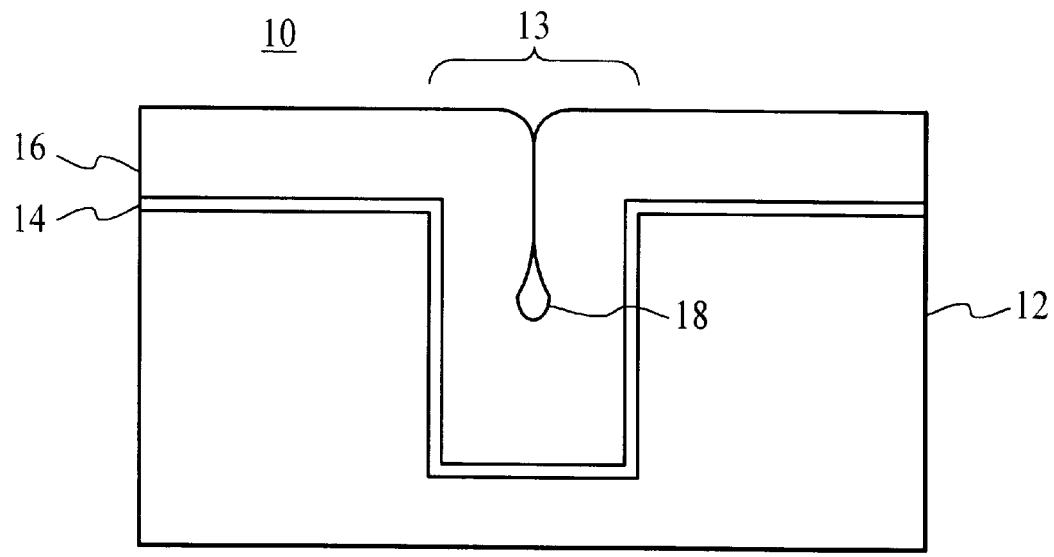
Figure 1D:
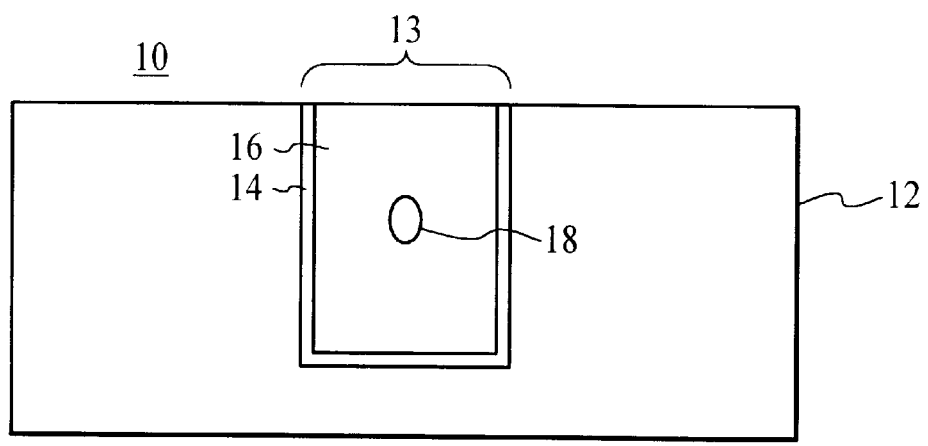

FIGS. 1A–1D are block diagrams depicting cross-sections of an interconnect 10 during the formation of the interconnect 10 using a conventional process. Typically, a damascene process is used to form the interconnect 10. First, as depicted in FIG. 1A, a trench 13 is formed in a substrate 12. Then, as shown in FIG. 1B, a barrier metal layer 14 is deposited. The barrier metal layer 14 prevents the metal which will form the interconnect 10 from diffusing through the substrate. A copper layer 16 is then deposited. Note that aluminum could also be used for the interconnect 10. Deposition of the copper layer 16 continues until the copper layer 16 fills the trench 13, as shown in FIG. 1C. The portion of the copper layer 16 and the barrier metal layer 14 outside of the trench 13 are then removed, as depicted in FIG. 1D.

Although the copper interconnect 10 shown in FIGS. 1A–1D functions, one of ordinary skill in the art will readily realize that, as shown in FIG. 1C, as the copper layer 16 fills the trench 13, the copper may pinch off. This pinching off leaves a void 18 within the copper layer 16. Because the copper is subject to electromigration, the void 18 can work as a nucleus for growth. The void 18 can, therefore, grow to fill the entire cross-section of the copper layer 16 in the copper interconnect 10. When this occurs, the copper interconnect 10 fails.

The present invention provides for a method and system for providing a copper interconnect having reduced failure due to voids or electromigration. The present invention will be described in terms of a particular process for forming a copper interconnect and use of particular components, such as barrier metals and copper. However, one of ordinary skill in the art will readily recognize that this method and system will operate effectively for other types of components, such as aluminum used for the interconnect, and different processes.

Figure 2A:
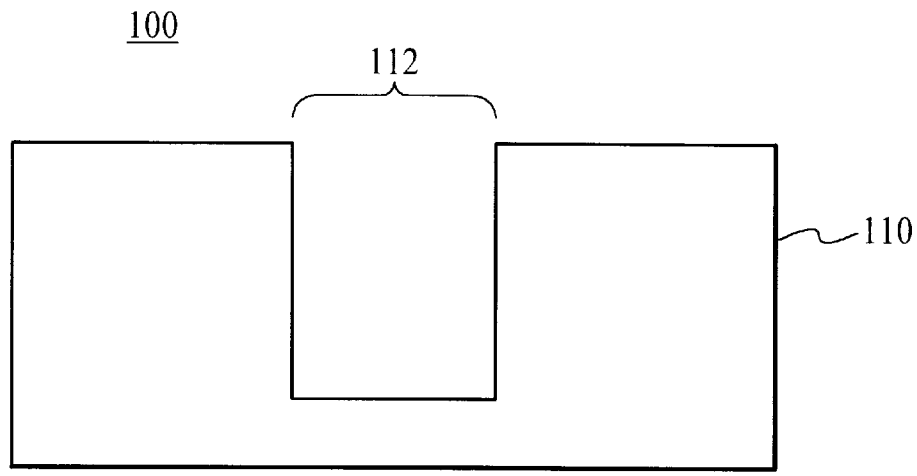
FIGS. 2A–2E are block diagrams depicting the cross-section of a copper interconnect during formation of the copper interconnect in accordance with the method and system.
Figure 2B:
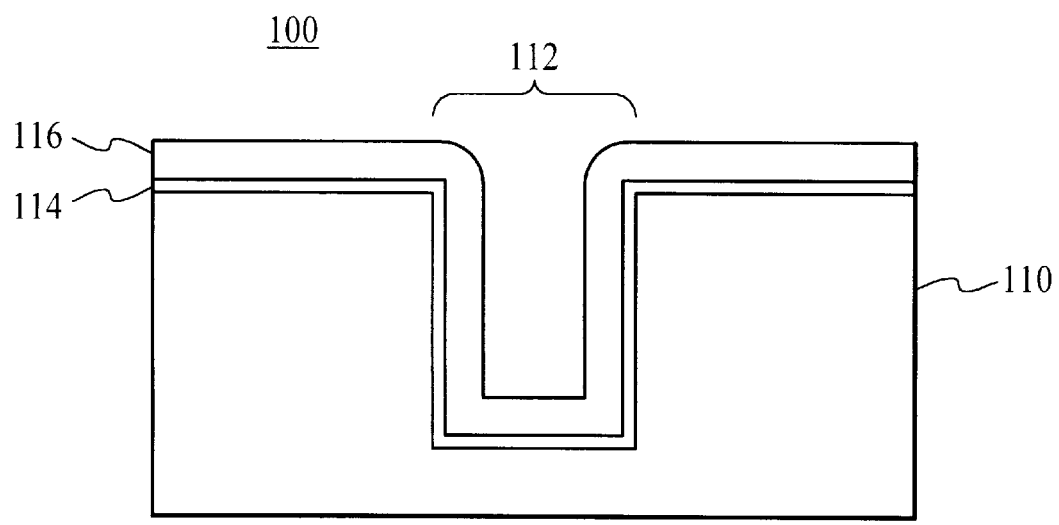

To more particularly illustrate the method and system in accordance with the present invention, refer now to FIGS. 2A–2E depicting block diagrams of cross-sections of one embodiment of an interconnect 100 during formation of the interconnect 100. The present invention includes forming a trench 112 in a substrate 110, as depicted in FIG. 2A. Referring now to FIG. 2B, a barrier metal layer 114 is deposited. The barrier metal layer 114 prevents migration of a subsequently deposited copper layer.

Deposition of a first copper layer 116 is then commenced. In an alternative embodiment, aluminum could be used to form the layer 116. The first copper layer 116 does not fill the trench 112. In a preferred embodiment, the copper layer 116 is plated. Instead, deposition of the copper layer 116 is terminated when the copper only fills the trench 112 approximately halfway. In a preferred embodiment, the thickness of the first copper layer 116 is approximately 0.1 micron. Because the deposition of the first copper layer 116 is terminated when the first copper layer 116 is very thin, there will be no voids in the first copper layer 116.

The appropriate thickness for the first copper layer is a thickness such that deposition of the copper is terminated before the copper pinches off, forming a void. This thickness can depend on the width of the copper interconnect. In a preferred embodiment, the appropriate thickness for the copper layer 116 is given by the relationship:

$$W-2D>0.05 \text{ micrometer}$$

where

W=Width of the interconnect

D=Thickness of the first copper layer

Figure 2C:
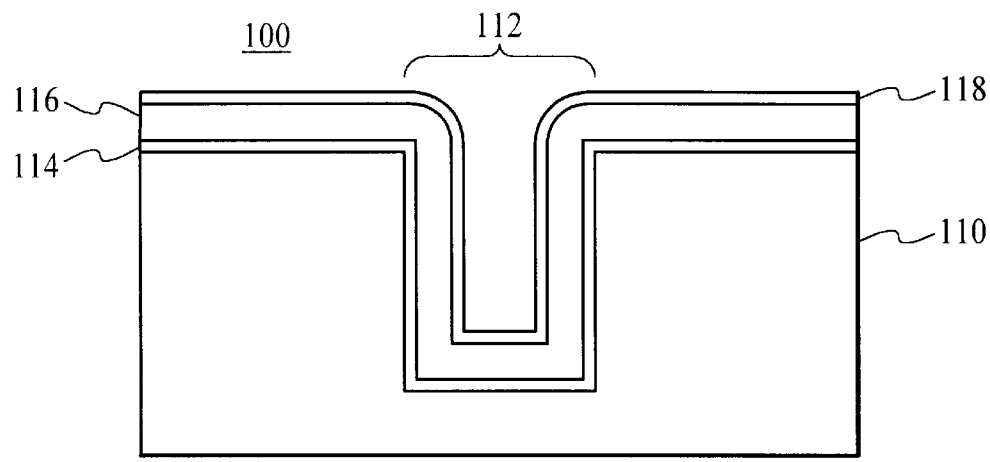

Referring now to FIG. 2C, a second barrier metal layer 118 is then formed. The second barrier metal layer 118 is composed of a material that is resistant to electromigration. In a preferred embodiment, the second barrier metal layer 118 is composed of cobalt, tungsten, and phosphorus. Also in a preferred embodiment, the second barrier metal layer 118 is conductive, allowing the entire interconnect 100 to carry electrical signals. In addition to cobalt and tungsten, another element which could be used due to its resistance to electromigration is titanium-nitride. In one embodiment, the second barrier metal layer 118 is very thin. In a preferred embodiment, the second barrier metal layer 118 is only approximately a few hundred Angstroms thick.

Figure 2D:
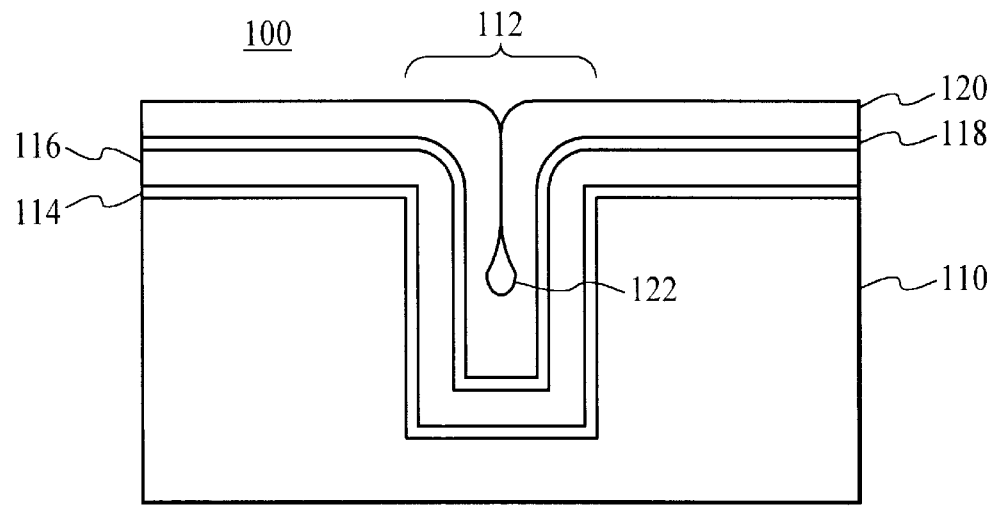
Figure 2E:
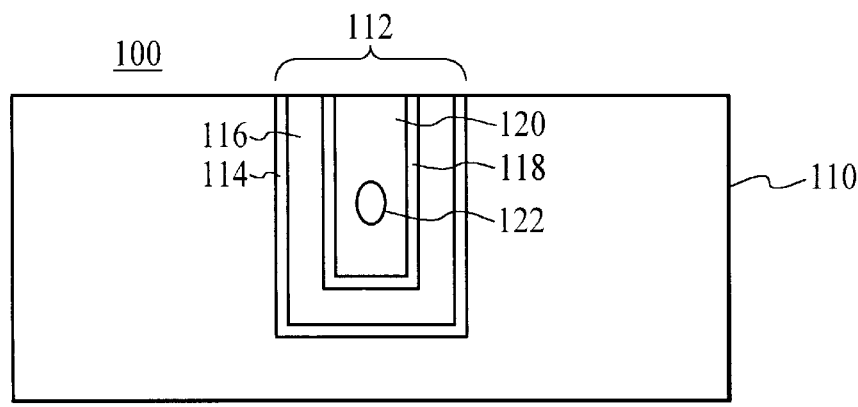

Referring now to FIG. 2D, a second copper layer 120 is then deposited to fill the trench 112. As the second copper layer 120 grows, there is a possibility that the copper will pinch off, leaving a void 122. The portions of the first copper layer 116, the second barrier metal layer 118, and the second copper layer 120 outside of the trench 112 are then removed, leaving the structure depicted in FIG. 2E.

Although the void 122 may form in the second copper layer 120, the reliability of the copper interconnect 100 is improved. The second copper layer 120 is subject to electromigration. As a result, the void 122 may grow. However, the second barrier metal layer 118 is highly resistant to electromigration. As a result, the cross-section of the void 122 will not grow beyond the second barrier metal layer 118. The void 122 will not fill the entire cross-section of the interconnect 100. Thus, the interconnect 100 will be less subject to failure, and reliability of the interconnect 100 is improved.

Figure 3A:
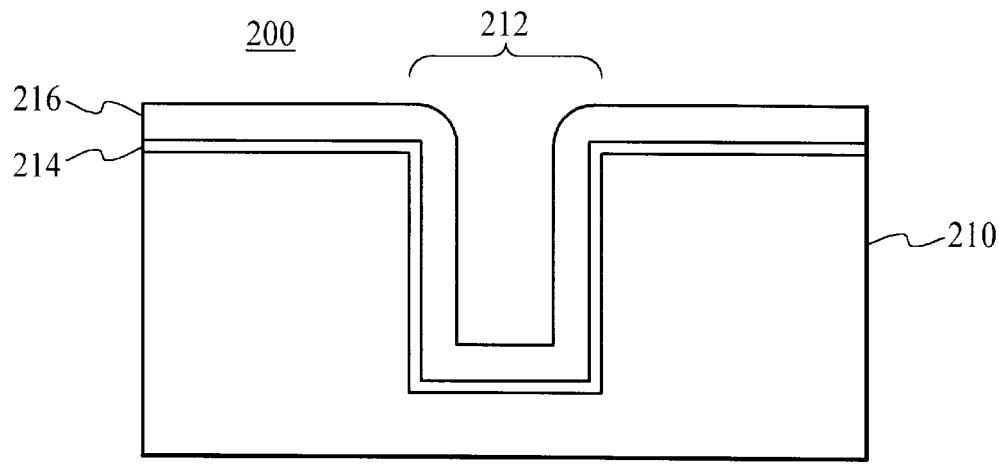
FIGS. 3A–3C are diagrams depicting the cross-section of a copper interconnect during formation of the copper interconnect in accordance with an alternate embodiment of the method and system.
Figure 3B:
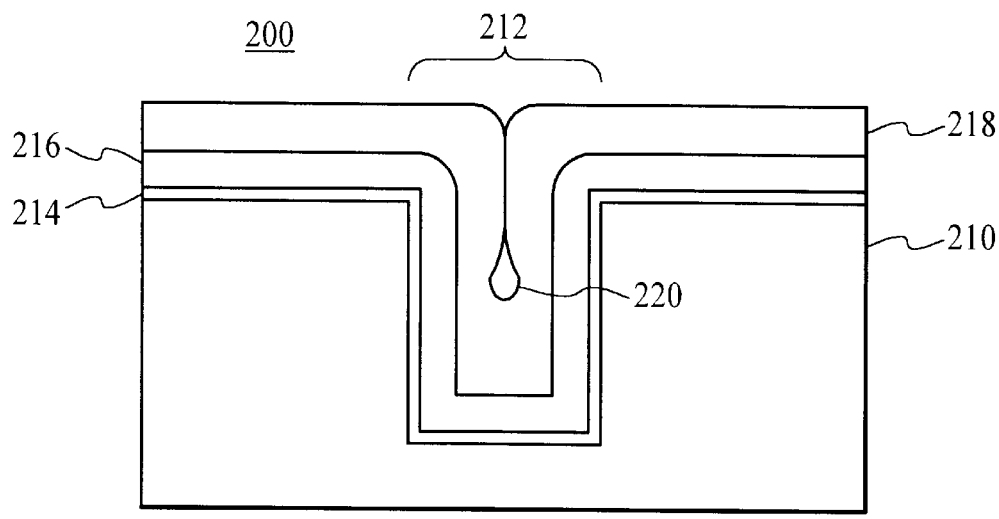
Figure 3C:
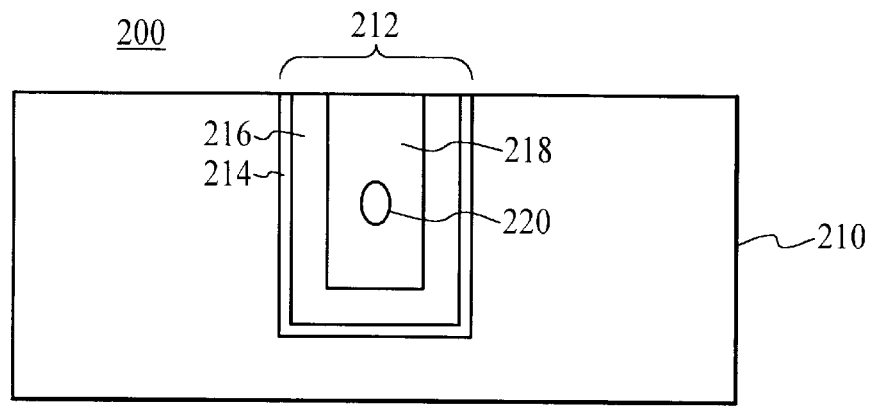

An alternate embodiment of an interconnect 200 formed in accordance with the method and system is depicted in FIGS. 3A–C. In this embodiment, the thickness of the second copper layer is reduced to zero. Thus, as depicted in FIG. 3A, a barrier metal layer 214 and first copper layer 216 are deposited in the trench 212. As discussed above, deposition of the first copper layer 216 is terminated prior to the copper pinching off and forming voids. As depicted in FIG. 3B, a second barrier metal layer 218 is then deposited. No second copper layer is deposited. The portions of the first barrier metal layer 214, the second barrier metal layer 218, and the copper layer 216 outside of the trench 212 are then removed, resulting in the structure shown in FIG. 3C.

In addition, either or both of the first copper layer 116 and the second copper layer 120 in the interconnect 100 or the first copper layer 216 of the interconnect 200 could be doped with impurities. Examples of such impurities are Zr, Pd, Sn, and Mg. Introduction of these impurities further enhances the resistance of the interconnect 100 or 200 to electromigration.

A method and system has been disclosed for providing an interconnect having reduced failure due to voids.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing an interconnect on a substrate comprising the steps of:

providing a first barrier layer on the substrate;

providing a first layer on the first barrier layer, the first layer being subject to electromigration, the first layer having a thickness, the thickness of the first layer being smaller than required to support formation of a void;

providing a second barrier layer, the second barrier layer being resistant to electromigration; and providing a second layer, the second layer being subject to electromigration, the second barrier layer being disposed between the first layer and the second layer.

2. The method of claim 1 wherein the step of providing the first layer further includes the step of providing a first copper layer.

3. A method for providing an interconnect on a substrate comprising the steps of:

providing a first layer on the substrate, the first layer being subject to electromigration, the first layer having a thickness, the thickness of the first layer being smaller than required to support formation of a void, the first layer being a first copper layer;

providing a first barrier layer, the first barrier layer being resistant to electromigration; and providing a second layer, the second layer being subject to electromigration, the second layer being a second copper layer; the first barrier layer being disposed between the first layer and the second layer.

4. The method of claim 3 wherein the step of providing the first copper layer further includes the step of:

providing a first doped copper layer.

5. The method of claim 3 wherein the step of providing the second copper layer further includes the step of:

providing a second doped copper layer.

6. The method of claim 4 wherein the step of providing the second copper layer further includes the step of:

providing a second doped copper layer.

7. The method of claim 6 wherein the first barrier layer further includes cobalt, tungsten, and phosphorus.

8. The method of claim 7 wherein the thickness of the first layer is less than or equal to approximately 0.1 micron.

9. The method of claim 8 wherein the step of providing a first barrier layer further includes the step of providing a first barrier layer having a barrier layer thickness of approximately a few hundred Angstroms.

10. The method of claim 9 further comprising the step of:

providing a second barrier layer, the second barrier layer being disposed between the first layer and the substrate.

11. A method for providing an interconnect on a substrate comprising the steps of:

providing a first barrier layer on the substrate;

providing a first layer on the first barrier layer, the first layer being subject to electromigration, the first layer having a thickness, the thickness of the first layer being smaller than required to support formation of a void; and providing a second barrier layer on the first layer, the second barrier layer being resistant to electromigration.

12. The method of claim 11 wherein the step of providing the first layer further includes the step of providing a first copper layer.

13. A method for providing an interconnect on a substrate comprising the steps of:

provisioning a first layer on the substrate, the first layer being subject to electromigration, the first layer having a thickness, the thickness of the first layer being smaller than required to support formation of a void, the first layer being a first doped copper layer; and providing a first barrier layer on the first layer, the first barrier layer being resistant to electromigration.

14. The method of claim 13 wherein the step of providing the first barrier layer further includes cobalt, tungsten, and phosphorus.

15. The method of claim 14 wherein the thickness of the first layer is less than or equal to approximately 0.1 micron.

16. The method of claim 15 wherein the step of providing a first barrier layer further includes the step of providing a first barrier layer having a barrier layer thickness of approximately a few hundred Angstroms.

17. The method of claim 16 further comprising the step of:

providing a second barrier layer, the second barrier layer being disposed between the first layer and the substrate.

18. The method of claim 1 wherein the substrate further includes at least one trench therein and wherein a portion of the first barrier layer, a portion of the first layer, a portion of the second barrier layer, and a portion of the second layer are within the at least one trench.

19. The method of claim 11 wherein the substrate further includes at least one trench therein and wherein a portion of the first barrier layer, a portion of the first layer, and a portion of the second barrier layer are within the at least one trench.

* * * * *